(12) United States Patent
Kohiro et al.

(10) Patent No.: US 7,595,259 B2
(45) Date of Patent: Sep. 29, 2009

(54) METHOD FOR MANUFACTURING COMPOUND SEMICONDUCTOR SUBSTRATE WITH PN JUNCTION

(75) Inventors: Kenji Kohiro, Tsukuba (JP); Kazumasa Ueda, Tsuchiura (JP); Masahiko Hata, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 136 days.

(21) Appl. No.: 11/597,711

(22) PCT Filed: May 27, 2005

(86) PCT No.: PCT/JP2005/010210
§ 371 (c)(1),
(2), (4) Date: Nov. 28, 2006

(87) PCT Pub. No.: WO2005/119744
PCT Pub. Date: Dec. 15, 2005

(65) Prior Publication Data
US 2007/0232018 A1    Oct. 4, 2007

(30) Foreign Application Priority Data
Jun. 1, 2004    (JP)    ............... 2004-162821

(51) Int. Cl.
*H01L 21/4763*    (2006.01)
(52) U.S. Cl. ............... 438/483; 438/478; 438/481; 257/E21.111; 257/E21.126; 257/E21.542; 257/E21.569; 257/E21.697

(58) Field of Classification Search ............... 438/469, 438/481, 492, 618, 716, 758, 403, 409, 413, 438/424, 478, 483; 257/E21.102, E21.371, 257/E21.462, E21.111, 126, 542, 569, 697
See application file for complete search history.

(56) References Cited

U.S. PATENT DOCUMENTS 4,686,554 A * 8/1987 Ohmi et al. ............... 257/443
(Continued)

FOREIGN PATENT DOCUMENTS

JP    05-29231    2/1993
(Continued)

OTHER PUBLICATIONS

Heinlein, et al., "Selective Area Regrowth of n-GaAs with Reduced Interface Carrier Depletion Using Arsenic Passivation", Journal of Crystal Growth, 201/202 (1999), pp. 586-589.
(Continued)

*Primary Examiner*—Michael S Lebentritt
(74) *Attorney, Agent, or Firm*—Birch, Stewart, Kolasch & Birch, LLP

(57) ABSTRACT

A compound semiconductor substrate manufacturing method suitable for manufacturing a compound semiconductor element having high electrical characteristics. The compound semiconductor substrate manufacturing method is a method for manufacturing a compound semiconductor substrate having pn junction, including an epitaxial growing process, a selective growing process and other discretionary processes after the epitaxial growing process. The highest temperatures in the selective growing process and other discretionary processes after the epitaxial growing process are lower than that in the epitaxial growing process prior to the selective growing process.

7 Claims, 7 Drawing Sheets

U.S. PATENT DOCUMENTS

| | | | |
|---|---|---|---|
| 4,826,784 A * | 5/1989 | Salerno et al. | 438/23 |
| 4,910,165 A * | 3/1990 | Lee et al. | 438/409 |
| 5,017,517 A * | 5/1991 | Mochizuki et al. | 438/494 |
| 5,076,860 A * | 12/1991 | Ohba et al. | 148/33.1 |
| 5,161,167 A * | 11/1992 | Murakami et al. | 372/46.01 |
| 5,336,909 A * | 8/1994 | Katoh et al. | 257/197 |
| 5,480,833 A * | 1/1996 | Kikkawa et al. | 117/954 |
| 5,762,706 A * | 6/1998 | Saito et al. | 117/105 |
| 6,252,261 B1 * | 6/2001 | Usui et al. | 257/190 |
| 6,348,096 B1 * | 2/2002 | Sunakawa et al. | 117/88 |
| 6,649,434 B2 * | 11/2003 | Iwata et al. | 438/22 |
| 6,861,305 B2 * | 3/2005 | Koike et al. | 438/200 |
| 6,905,972 B2 * | 6/2005 | Oda | 438/716 |
| 6,936,357 B2 * | 8/2005 | Melnik et al. | 428/698 |
| 6,939,730 B2 * | 9/2005 | Goto et al. | 438/22 |
| 6,969,670 B2 * | 11/2005 | Biwa et al. | 438/488 |
| 7,163,876 B2 * | 1/2007 | Nagai et al. | 438/478 |

FOREIGN PATENT DOCUMENTS

| | | |
|---|---|---|
| JP | 06-5514 | 1/1994 |
| JP | 10-41321 A | 2/1998 |
| JP | 11-204829 | 7/1999 |
| JP | 2003-77844 A | 3/2003 |
| JP | 2003-124124 A | 4/2003 |

OTHER PUBLICATIONS

Okamoto, et al., "Selective Epitaxial Growth of Gallium Arsenide by Molecular Beam Epitaxy", Appl. Phys. Lett. 51 (19), Nov. 9, 1987, pp. 1512-1514.

* cited by examiner (a)

(b)

(c)

(d)

US 7,595,259 B2

METHOD FOR MANUFACTURING COMPOUND SEMICONDUCTOR SUBSTRATE WITH PN JUNCTION

TECHNICAL FIELD

The present invention relates to a method for manufacturing a compound semiconductor substrate with pn junction by means of an epitaxial growth method including a selective growth step.

BACKGROUND ART

As known epitaxial growth methods in which compound semiconductor substrates are manufactured by epitaxially growing compound semiconductor function layers on substrates in order, there are a method which includes a selective growth step at which a mask made of $SiO_2$ or the like is formed on a compound semiconductor function layer grown on a substrate, and then, subsequently, a compound semiconductor layer is epitaxially grown at places where no mask is formed at the same temperature as that at the epitaxial growth step performed before the formation of the mask (see, for example, JP-A No. 11-204829) and a method which includes a selective growth step at which a mask made of $SiO_2$ or the like is formed on a compound semiconductor function layer grown on a substrate, and then, subsequently, a compound semiconductor layer is epitaxially grown at a temperature which is higher than that at the epitaxial growth step performed before the formation of the mask (see, for example, JP-A No. 6-5514). Compound semiconductor substrates with pn junction (which includes p-i-n junction where an spacer layer sandwiched between a p-type layer and a n-type layer is present) are manufactured by using such manufacturing methods including the selective growth steps (hereinafter referred to as "selective growth method").

Compound semiconductor substrates are used for the manufacture of compound semiconductor devices such as Field Effect Transistors (FETs), Hetero Bipolar Transistors (HBTs), Laser Diodes (LDs), and Photo Diodes (PDs). In terms of an improvement in performance, these compound semiconductor devices are required to have improved electrical characteristics, and compound semiconductor substrates used for the manufacture of such compound semiconductor devices are also required to have excellent electrical characteristics.

DISCLOSURE OF THE INVENTION

An object of the present invention is to provide a method for manufacturing a compound semiconductor substrate suitable for the manufacture of a compound semiconductor device with excellent electrical characteristics.

The present inventors conducted extensive studies on a method for manufacturing a compound semiconductor substrate with pn junction in which a selective growth step is included. As a result, the present invention has been accomplished.

That is, the invention provides a method for manufacturing a compound semiconductor substrate with pn junction comprising an epitaxial growth step, a selective growth step thereafter and an optional other step, and wherein a maximum temperature at the selective growth step and the optional other step is lower than that at the epitaxial growth step.

The use of the method according to the invention makes it possible to obtain the compound semiconductor substrate suitable for the manufacture of compound semiconductor devices with excellent electrical characteristics such as a diode with a small reverse bias current and a transistor with a high amplification factor.

BEST MODE FOR CARRYING OUT THE INVENTION

Figure 1:
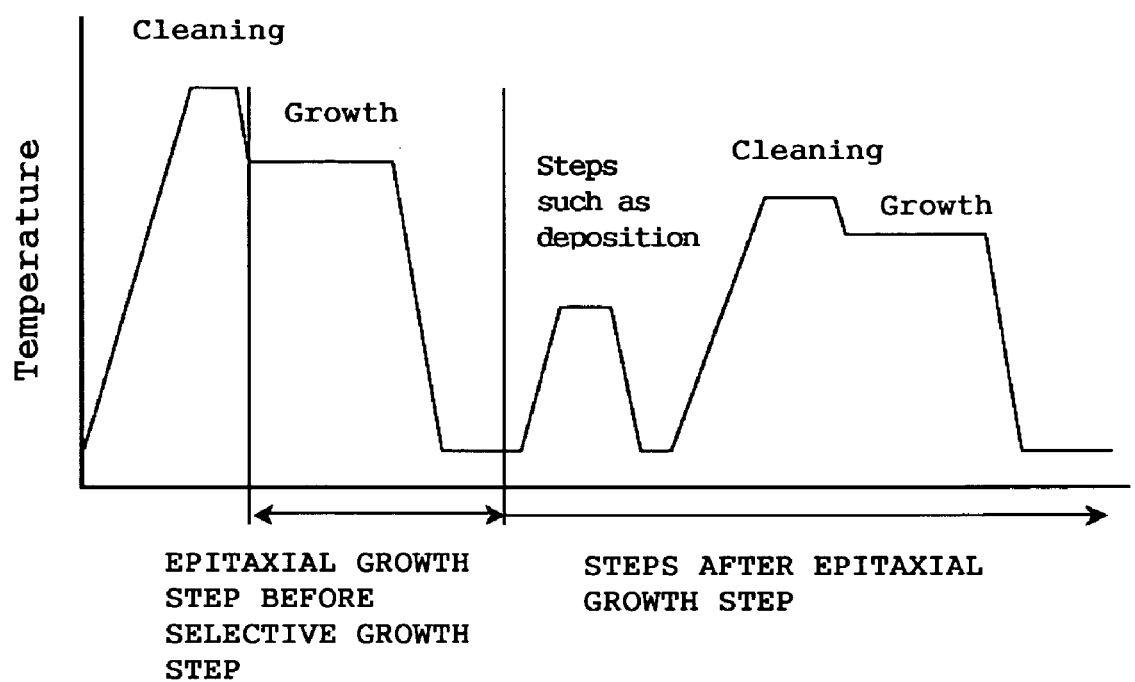
FIG. 1 is a chart of temperatures at respective steps according to an embodiment of the present invention.

A method for manufacturing a compound semiconductor substrate according to the present invention is a method for manufacturing a compound semiconductor substrate with pn junction by epitaxially growing compound semiconductor function layers on a substrate in order and includes an epitaxial growth step and a selective growth step. The method for manufacturing a compound semiconductor substrate according to the invention includes at least one epitaxial growth step before the selective growth step and may include other steps (for example, an electrode formation step) after the selective growth step.

In the method for manufacturing a compound semiconductor substrate according to the invention, a maximum temperature at the steps performed after the epitaxial growth step is lower than that at the epitaxial growth step performed before the selective growth step. The difference between the maximum temperature of the epitaxial growth step performed before the selective growth step and the maximum temperature of the steps performed after the epitaxial growth step is preferably not lower than 30° C., more preferably not lower than 40° C., and preferably not higher than 300° C.

Temperatures at the steps performed after the epitaxial growth step are preferably from 350° C. to 720° C. A temperature at the epitaxial growth step performed before the selective growth step may be suitably selected so as to satisfy the above conditions according to the temperatures at the steps performed after the epitaxial growth step and is, therefore, usually from 350° C. to 750° C.

The term "the epitaxial growth step before the selective growth step" used herein refers to the entire epitaxial growth step performed before the selective growth step (in cases where there are plural selective growth steps, it means an initial one). However, for example, the entire step does not include a substrate cleaning step which is performed before the epitaxial growth step (and which, therefore, does not involve the epitaxial growth step). A temperature at the substrate cleaning step is higher than that at the epitaxial growth step (see, for example, JP-A No. 5-29231) and sometimes exceeds the maximum temperature at the epitaxial growth step. Even though the temperature at the substrate cleaning step exceeds the maximum temperature, that has no effect on the compound semiconductor function layers grown by means of epitaxial growth. Because the cleaning step is performed before the start of the epitaxial growth step. At this point, the compound semiconductor function layers are not formed.

And further, the term "the steps after the epitaxial growth step" used herein refers to all the steps performed after the epitaxial growth step. In cases where there are plural epitaxial growth steps, the term refers to all the steps performed after the final epitaxial growth step. "The steps after the epitaxial growth step" may be any step provided that the maximum temperature at the steps is lower than the maximum temperature at "the epitaxial growth step before the selective growth step"; therefore the steps performed after the epitaxial growth step include the selective growth step, a step of epitaxially growing a compound semiconductors and a step of growing a compound semiconductor by using a method other than epitaxial growth. Examples thereof include the substrate cleaning step and a mask formation step which are required for selective growth and performed immediately before selective growth.

In the selective growth method, when the maximum temperature at the steps performed after the epitaxial growth step is not less than that at epitaxial growth step performed before the selective growth step, the electrical characteristics of a resulting compound semiconductor device degrade. The reason for the degradation is not clear, but it is surmised as described below. First, diffusion of constituent elements and doped elements occur at interfaces between the layers, and therefore the precipitousness of the compositions is impaired at the interfaces, thereby its electrical characteristics degrade. Secondly, there is the difference in coefficient of thermal expansion between the mask made of $SiO_2$ or the like and each compound semiconductor function layer, and hence when the maximum temperatures at the steps performed after the selective growth step are high, stress increases and dislocation occurs, thereby the electrical characteristics of the device are degraded.

Next, embodiments of the present invention will be described in detail with reference to the drawings. The temperature at each step is shown in FIG. 1

A semi-insulating GaAs substrate is placed into a furnace of metal-organic chemical vapor deposition (MOCVD) apparatus and a rise in temperature is started while flowing an arsine gas. Then the temperature of the substrate is raised so as to exceed its growth temperature to remove oxides and so on from the surface of the substrate. Furthermore, the partial pressure of the arsine gas is set at a predetermined value to clean the substrate. Thereafter, the temperature is lowered to the substrate growth temperature to grow a buffer layer and a $n^+$-GaAs layer.

A $SiO_2$ insulating film is deposited on the resulting epitaxial substrate and openings are formed by means of etching.

The epitaxial substrate on which the $SiO_2$ pattern is formed is placed into the furnace of MOCVD to clean the substrate and grow a $p^+$-GaAs layer on the substrate.

Figure 2:
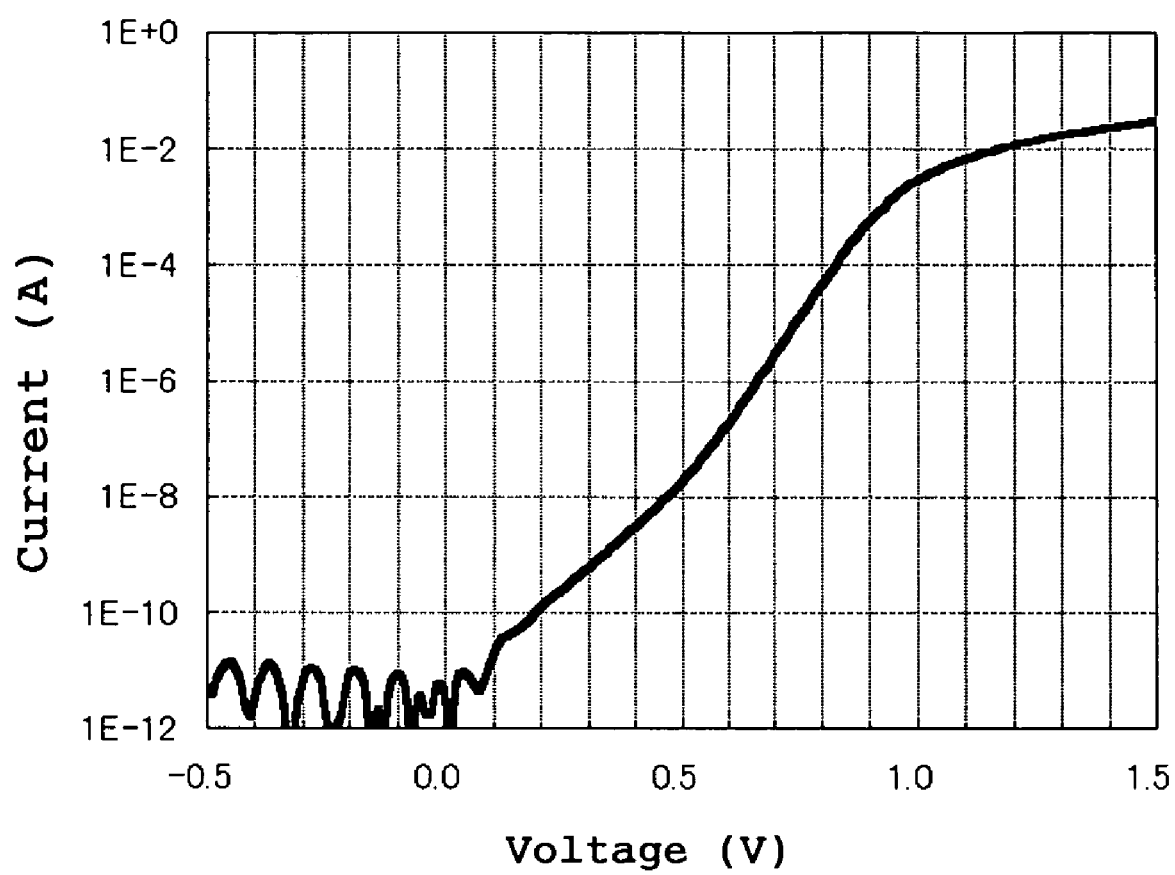
FIG. 2 is a graph of current-voltage characteristics of a pn diode made by using a manufacturing method according to the invention.

The current-voltage characteristics of the resulting device with pn junction are shown in FIG. 2 The device exhibits rectification effect shown in Fif. 2. When a reverse (backward) bias is applied, current does not flow except a slight reverse leakage current, and when a forward bias is applied, current flows. One of the most simple devices utilizing such a phenomenon is a pn diode.

Figure 3:
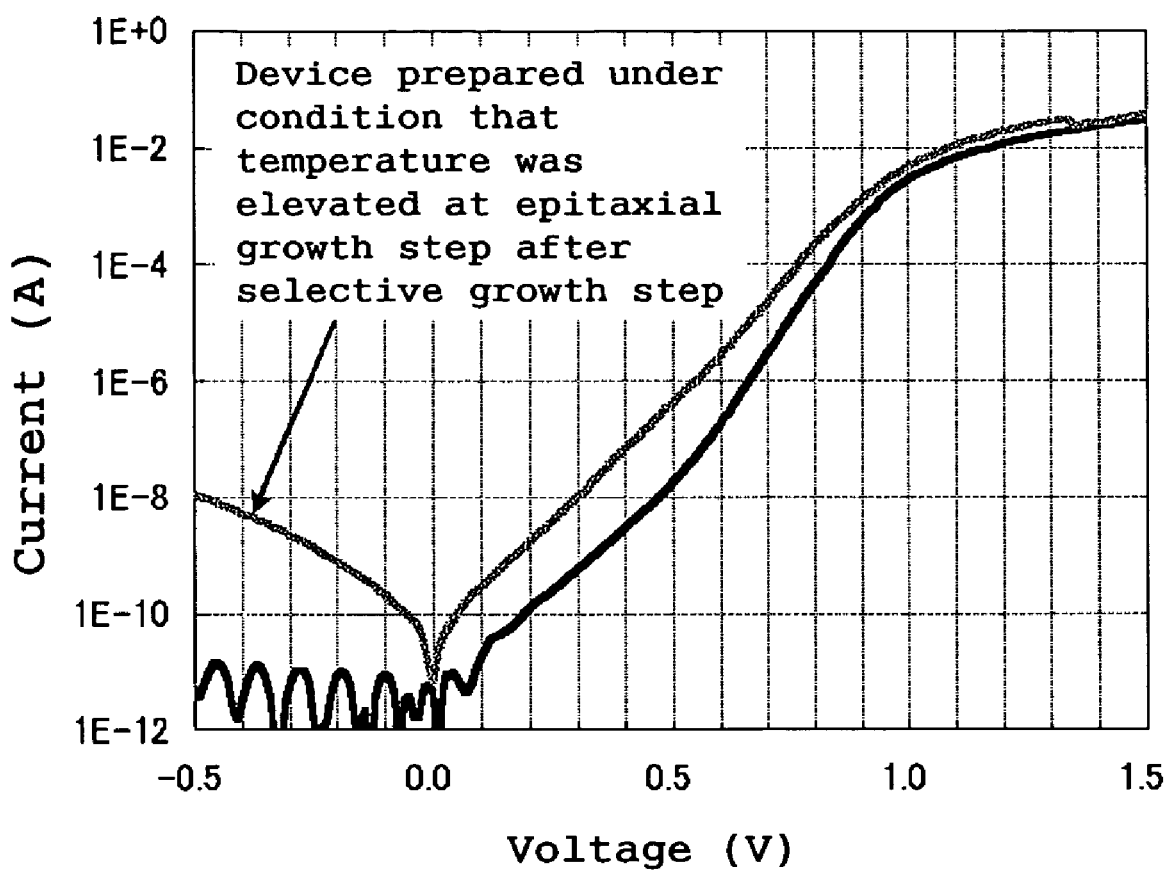
FIG. 3 is a graph of current-voltage characteristics of a pn diode manufactured under the condition that a maximum temperature at steps performed after a selective growth step is made higher than a maximum temperature at an epitaxial growth step performed before the selective growth step.

The most important characteristics of the device are reverse leakage current value and reverse withstand voltage. The smallness of reverse leakage current and the highness of reverse withstand voltage mean electrical characteristics are excellent. An device, which is manufactured under the condition that the maximum temperature at the selective growth step or the steps performed thereafter is higher than that at the epitaxial growth step performed before the selective growth step, indicates a tendency for reverse leakage current to increase as shown by the arrow of FIG. 3.

EXAMPLES

Example 1

A pn junction device (pn diode) shown in FIG. 4(d) was manufactured by using the procedure below. The pn junction device has a semi-insulating GaAs substrate 1, a buffer layer 2, a $n^+$-GaAs layer 3, a $P^+$-GaAs layer 4, a p-type electrode 5, a n-type electrode 6, and a $SiO_2$ insulating film layer 7. Layer structures (cross-sectional views) obtained at respective steps performed during the manufacture of the pn junction device are shown in FIG. 4(a) to 4(c).

The semi-insulating GaAs substrate 1 was placed into the furnace of a MOCVD apparatus and cleaned at a temperature of 700° C. Thereafter, the buffer layer 2 and the $n^+$-GaAs layer 3 were grown on the semi-insulating GaAs substrate 1 in that order at a temperature of 650° C. by means of MOCVD.

Then a selective growth step was performed. The $SiO_2$ insulating film 7 was formed on the $n^+$-GaAs layer 3 and patterning was conducted by using a photoresist as a mask to remove the $SiO_2$ insulating film (to form an opening) present in a region where the $p^+$-GaAs layer 4 is to be formed [see FIG. 4(a)]. The resulting substrate was placed into the MOCVD apparatus and subjected to cleaning at a temperature raised to 508° C. After that, the $p^+$-GaAs layer 4 was grown in the opening at a temperature of 508° C. [see FIG. 4(b)].

Figure 4:
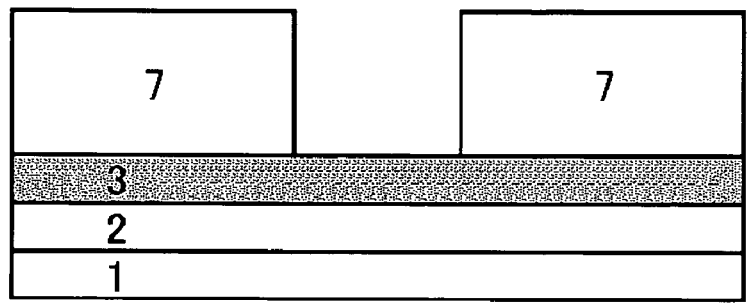
FIG. 4 is a cross-sectional view of layered structures formed at respective steps performed during the manufacture of a pn diode according to an embodiment of the invention.
Figure 4:
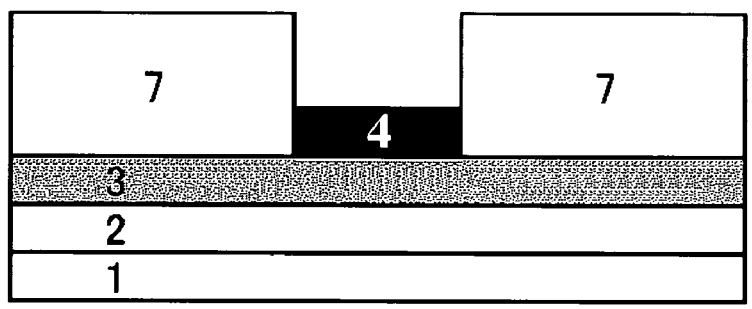
Figure 4:
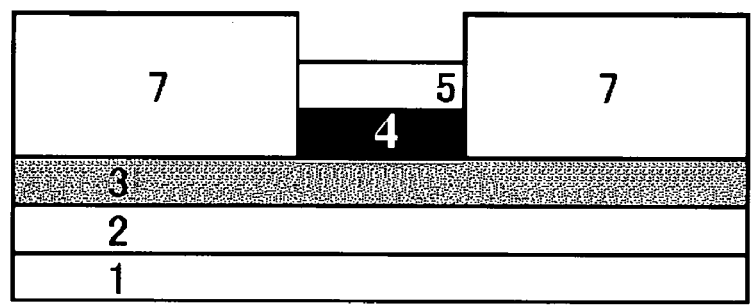
Figure 4:
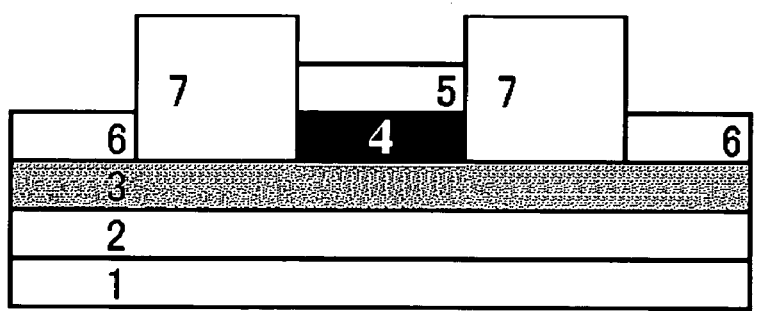

After the selective growth step, the p-type electrode 5 is formed on the $p^+$-GaAs layer 4 by the method of sputtering [see FIG. 4(c)]. The $SiO_2$ insulating film present in a region where the n-type electrode 6 is to be formed was removed (an opening was formed) by using a photoresist as a mask and the n-type electrode 6 was formed. Thereafter, both p-type electrode and n-type electrode were ohmically annealed at a temperature of 380° C. to give a pn diode [see FIG. 4(d)].

Figure 5:
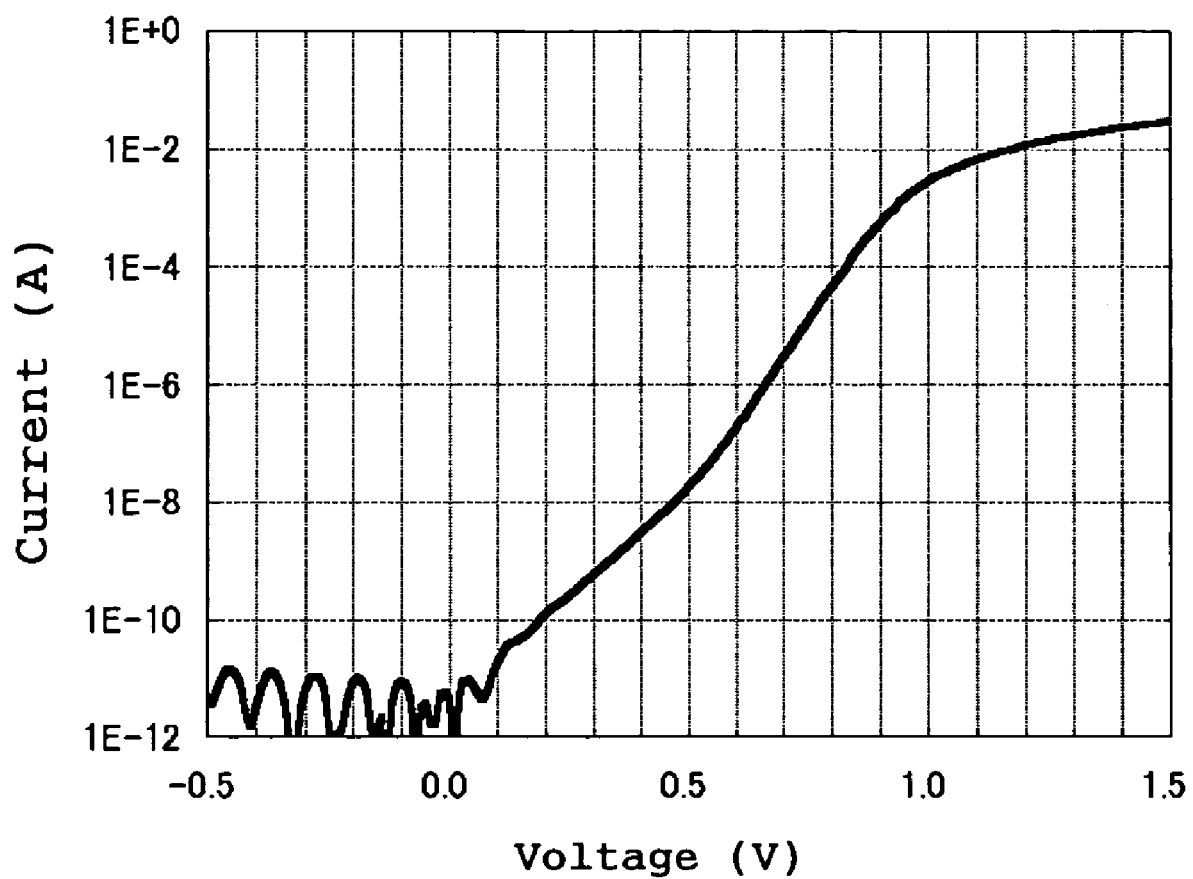
FIG. 5 is a graph of current-voltage characteristics of a pn diode described in Example 1.

The current-voltage characteristics of the resulting pn diode are shown in FIG. 5. The pn diode had a very small reverse leakage current.

Example 2

Figure 6:
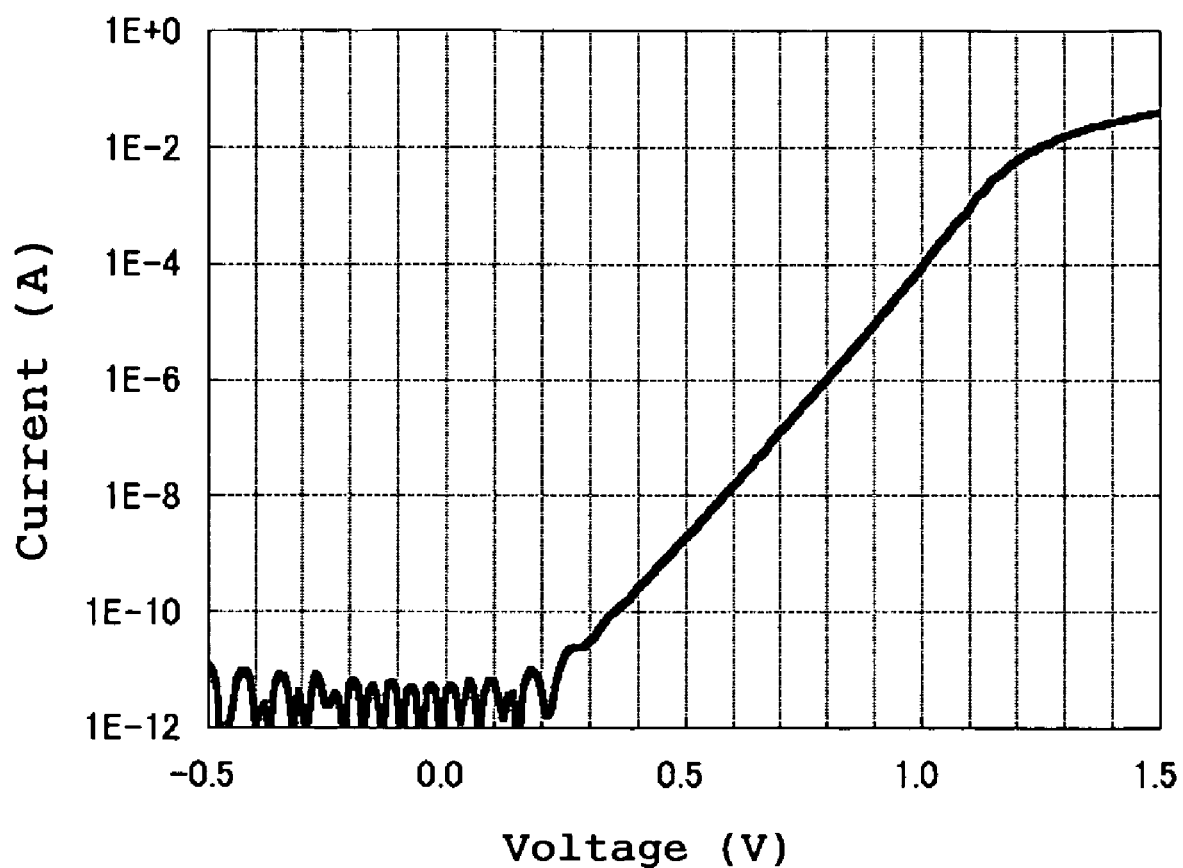
FIG. 6 is a graph of current-voltage characteristics of a pn diode described in Example 2.

A pn diode was manufactured by performing the same steps as those described in Example 1 except that the substrate cleaning temperature before the selective growth was changed from 508° C. to 588° C. and the growth temperature of the $p^+$-GaAs layer 4 was changed from 508° C. to 588° C. The current-voltage characteristics of the resulting pn diode are shown in FIG. 6. The pn diode had a very small reverse leakage current.

Comparative Example 1

Figure 7:
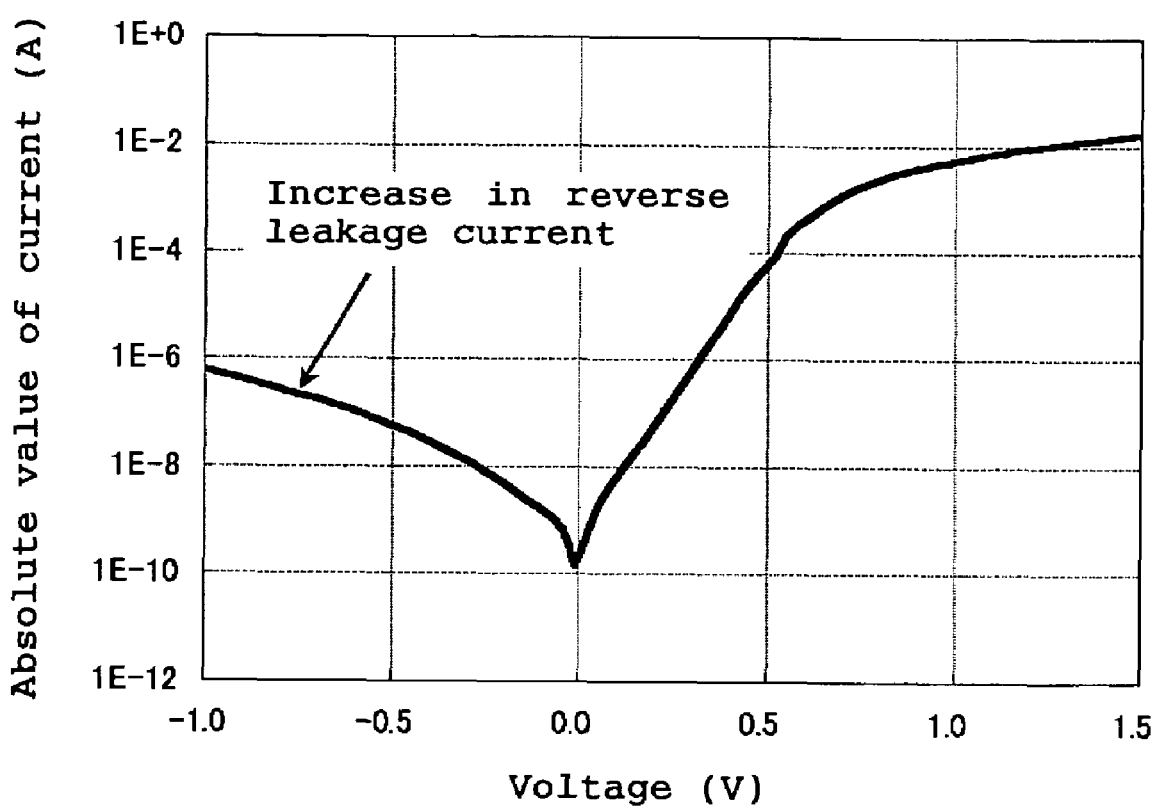
FIG. 7 is a graph of current-voltage characteristics of a pn diode described in Comparative Example 1.

A pn diode was manufactured by performing the same steps as those described in EXAMPLE 1 except that the substrate cleaning temperature before the selective growth was changed from 508° C. to 680° C. and the growth temperature of the p⁺-GaAs layer 4 was changed from 508° C. to 620° C. The current-voltage characteristics of the resulting pn diode are shown in FIG. 7. The pn diode had a very large reverse leakage current.

The exemplary methods for manufacturing the compound semiconductor substrate and the pn diode by means of Metal-Organic Chemical Vapor Deposition (MOCVD) have been described herein above; likewise, other devices with pn junction such as a Junction-type Field-Effect Transistor (JFET) and a Hetero Bipolar Transistor (HBT) may be manufactured, and therefore those with excellent electrical characteristics is obtained. In addition, the compound semiconductor function layers and the compound semiconductor layers have been grown by means of metal-organic chemical deposition (MOCVD); likewise, those may be grown by means of molecular beam epitaxy (MBE) and so on, which makes it possible to obtain a compound semiconductor substrate and an device with excellent electrical characteristics.

The invention claimed is:

1. A method for manufacturing a compound semiconductor substrate with pn junction, comprising an epitaxial growth step, a mask formation step and a a selective growth step in this order,
    wherein a maximum temperature at the selective growth step is lower than that at the epitaxial growth step.

2. The method according to claim 1, wherein the difference between the maximum temperature at the selective growth step and the maximum temperature at the epitaxial growth step is from 30° C. to 300° C.

3. A method for manufacturing a compound semiconductor substrate with pn junction, comprising an epitaxial growth step, a mask formation step, a selective growth step in this order, and a third step,
    wherein the selective growth step and the third step are, performed after the epitaxial growth step, and a maximum temperature at both of the selective growth step and the third step is lower than that at the epitaxial growth step.

4. The method according to claim 3, wherein the difference between the maximum temperature at the epitaxial growth step and the maximum temperature at both of the selective growth step and the third step is from 30° C. to 300° C.

5. The method according to claim 3, wherein the third step is an electrode formation step.

6. The method according to claim 1, wherein the substrate is GaAs.

7. The method .according to claim 3, wherein the substrate is GaAs.

* * * * *